United States Patent [19]
Park

[11] Patent Number: 5,835,446
[45] Date of Patent: Nov. 10, 1998

[54] COLUMN DECODER FOR SEMICONDUCTOR MEMORY DEVICE WITH PREFETCH SCHEME

[75] Inventor: Churoo Park, Kyungki-do, Rep. of Korea

[73] Assignee: Samsun Electronic, Co., Ltd., Suwon, Rep. of Korea

[21] Appl. No.: 715,847

[22] Filed: Sep. 19, 1996

[30] Foreign Application Priority Data

Sep. 19, 1995 [KR] Rep. of Korea ................... 1995-30740

[51] Int. Cl.[6] ........................................................ G11C 8/00
[52] U.S. Cl. ............... 365/233; 365/189.05; 365/230.06; 365/220; 365/190
[58] Field of Search .............................. 365/233, 189.05, 365/230.06, 220, 190, 189.08, 230.02

[56] References Cited

U.S. PATENT DOCUMENTS 5,390,149  2/1995  Vogley et al. ....................... 365/189.01
5,661,679  8/1997  Struck .................................... 365/149

Primary Examiner—David C. Nelms
Assistant Examiner—Andrew Q. Tran
Attorney, Agent, or Firm—Marger, Johnson, McCollom, & Stolowitz, P.C.

[57] ABSTRACT

A method and apparatus for implementing a prefetch scheme in which a plurality of data are simultaneously read from memory cells of sequential addresses synchronized to an external signal and serially transferred from the memory cells to a temporary latch circuit which has a number of bits corresponding to the member of bits in the prefetch scheme. The bits in the temporary latch circuit are multiplexed and sequentially driven out of the memory device. The memory device includes a plurality of memory cells which are connected to an input/output line pair through a plurality of column select gates, each of which is controlled by an independent chip select line. A sense amplifier is connected to the input/output line pair for sensing and amplifying data from the input/output lines and to transmit data to the input/output lines. A data output buffer transfers the data from the sense amplifier to the outside of chip.

11 Claims, 8 Drawing Sheets

Fig. 7

<TABLE 1>

| CASE | φINTEL | SZ4 | SZ8 |
|---|---|---|---|
| BL=2 INTERLEAVE | H | L | L |
| BL=4 INTERLEAVE | H | H | L |
| BL=8 INTERLEAVE | H | H | H |
| BL=2 SEQUENTIAL | H | L | L |
| BL=4 SEQUENTIAL | L | H | L |
| BL=8 SEQUENTIAL | L | H | H |

Fig. 8

TABLE 2(i)

| INITIAL ADDRESS | | SEQUENTIAL MODE | | | | INTERLEAVE MODE | | | |
|---|---|---|---|---|---|---|---|---|---|
| A1 | A0 | | | | | | | | |
| 0 | 0 | 0 | 1 | 2 | 3 | 0 | 1 | 2 | 3 |
| 0 | 1 | 1 | 2 | 3 | 0 | 1 | 0 | 3 | 2 |
| 1 | 0 | 2 | 3 | 0 | 1 | 2 | 3 | 0 | 1 |
| 1 | 1 | 3 | 0 | 1 | 2 | 3 | 2 | 1 | 0 |

TABLE 2(ii)

| INITIAL ADDRESS | | | SEQUENTIAL MODE | | | | | | | | INTERLEAVE MODE | | | | | | | |
| --- | --- | --- | --- | --- | --- | --- | --- | --- | --- | --- | --- | --- | --- | --- | --- | --- | --- | --- |
| A2 | A2 | A0 | | | | | | | | | | | | | | | | |
| 0 | 0 | 0 | 0 | 1 | 2 | 3 | 4 | 5 | 6 | 7 | 0 | 1 | 2 | 3 | 4 | 5 | 6 | 7 |
| 0 | 0 | 1 | 1 | 2 | 3 | 4 | 5 | 6 | 7 | 0 | 1 | 0 | 3 | 2 | 5 | 4 | 7 | 6 |
| 0 | 1 | 0 | 2 | 3 | 4 | 5 | 6 | 7 | 0 | 1 | 2 | 3 | 0 | 1 | 6 | 7 | 4 | 5 |
| 0 | 1 | 1 | 3 | 4 | 5 | 6 | 7 | 0 | 1 | 2 | 3 | 2 | 1 | 0 | 7 | 6 | 5 | 4 |
| 1 | 0 | 0 | 4 | 5 | 6 | 7 | 0 | 1 | 2 | 3 | 4 | 5 | 6 | 7 | 0 | 1 | 2 | 3 |
| 1 | 0 | 1 | 5 | 6 | 7 | 0 | 1 | 2 | 3 | 4 | 5 | 4 | 7 | 6 | 1 | 0 | 3 | 2 |
| 1 | 1 | 0 | 6 | 7 | 0 | 1 | 2 | 3 | 4 | 5 | 6 | 7 | 4 | 5 | 2 | 3 | 0 | 1 |
| 1 | 1 | 1 | 7 | 0 | 1 | 2 | 3 | 4 | 5 | 6 | 7 | 6 | 5 | 4 | 3 | 2 | 1 | 0 |

Fig. 9

COLUMN DECODER FOR SEMICONDUCTOR MEMORY DEVICE WITH PREFETCH SCHEME

BACKGROUND OF THE INVENTION

1. Related Application

This application corresponds to Korean Patent Application No. 30740/1995, filed Sep. 19, 1995 in the name of Samsung Electronics Company, Ltd. and incorporated herein by reference.

2. Field of the Invention

This invention relates generally to semiconductor memory devices and more particularly to semiconductor memory devices employing a column decoder for a prefetch scheme.

3. Description of the Related Art

In general, a memory device includes a memory cell array which has a plurality of memory cells, each of which has an inherent address. A memory device also includes a data path for transferring data between the memory cell array and an output pin on a semiconductor memory chip. The architecture of the chip is determined by the coding methodology used for selecting a desired cell in the memory cell array and by the data path structure needed for transferring the data between the cell array and the outside of the chip. One methodology for coding and selecting desired cells in an array is referred to as a prefetch scheme which requires a specific chip architecture. FIG. 1 is a block diagram showing the configuration of a semiconductor memory device which employs a conventional prefetch scheme. The memory device of FIG. 1 includes a column decoder 40 which decodes a column address, a plurality of memory cells 50, a temporary latch circuit 60 and a multiplexer 70. Data from memory cells 50 are decoded by the column decoder 40 and stored in the temporary latch circuit 60. The multiplexer 70 sequentially outputs the plurality of data stored in the temporary latch circuit to the data output buffer 80 which then drives the data to the outside of the chip.

The most significant characteristic of the prefetch scheme of the circuit of FIG. 1 is that the number of bits in the temporary latch circuit 60 corresponds to the number of bits in the prefetch scheme. Assuming the number of bits is N, this prefetch method may be referred to as an N bit prefetch. In this case, N independent data paths exist between memory cell 50 and the temporary latch circuit 60, and between latch circuit 60 and a multiplexer 70. During a read operation, data in N cells 50 are simultaneously read and transferred in parallel to the N bit temporary latch 60 through the N independent data paths. Thereafter, the N data bits are multiplexed and then sequentially transmitted to the data output buffer 80.

In this case, if the output frequency of the data output buffer 80 is XHz, the interface between the temporary latch circuit 60 and the data output buffer 80 operates at an output frequency of XHz. However, the data path between the cells 50 and the temporary latch circuit 60 operates at a reduced frequency of X/N Hz. Thus, by using the conventional prefetch scheme, the output circuitry in the data path between a temporary latch circuit 60 and the output buffer 80 can be operates at a high frequency, while the memory cells 50 and the data path between cells 50 and temporary latch 60 can be operated at a lower frequency, thereby improving the design margin and increasing the reliability of the chip. A problem, however, with the foregoing configuration is that N independent data paths must be provided between the cells 50 and multiplexer 70 which inevitably increases the chip area required to lay out the memory device. Nonetheless, such a prefetch scheme has been considered to be the preferred scheme for achieving high bandwidth memory.

FIG. 2 shows the configuration of a typical 16 Mb synchronous DRAM (dynamic random access memory) which employs a two-bit prefetch scheme for decoding cells in a memory cell array. The circuit includes a plurality of memory cells 50 each of which is connected to a column select gate (3, 5, 7, 9, 11, . .) which are typically made of NMOS transistors. The control terminals of the column selects gates are connected in pairs to column select lines CSLi. Each pair of column select gates couples a pair of memory cells 50 to an input/output line pair 20. Each line of the input/output line pair is connected to a sense amplifier 100 and 200. There are also two temporary latch circuits associated with the input/output line pair 20. A pair of bit lines 10 which have identical coding values for column addresses CA1 to CA9 are connected to independent input/output lines 20, input/output sense amplifiers I/O S/A 100 and 200 and data output line DIO. Each pair of column select gates, which connect two-bit lines 10 to the input/output line pair 20, are controlled by the same column select line CSLi. In this example, which implements the two-bit prefetch scheme, each column select line CSLi is decoded using all of the column address lines except the least significant bit CA0. Instead, column address bit CA0 is used during the multiplexing operation, i.e. when data in the temporary latch circuit is output serially to the data output buffer. In a similar manner, when implementing a four-bit prefetch scheme, column address bits CA0 and CA1 are not used for decoding the column select lines CSLi, but instead are used for multiplexing.

FIG. 3A is a timing diagram showing the internal operation of the column address in a conventional prefetch scheme wherein the input address is an even number. FIG. 3B is a timing diagram showing the internal operation of the column address in a conventional prefetch scheme wherein the input address is an odd number. FIG. 3C is a timing diagram showing the internal operation of the same prefetch scheme wherein the input address is an odd number and the read command is repeatedly issued. As can been seed in FIG. 3A, if the input address is even, the internal portion of the chip can operate at 50 MHz even though the output operating frequency is 100 MHz. In contrast, if the input address is odd, as shown in FIG. 3B, the cycle of the column address CA1 is changed with respect to the next cycle, and therefore, the internal portion of the chip must also operate at 100 MHz to achieve an output operating frequency of 100 MHz. This is more apparent in the case of a read interference as seen in FIG. 3C. Thus, even though the conventional prefetch scheme should be able to reduce the internal operating frequency of the chip by a factor that is determined by the number of prefetch bits, i.e., two bits in this example, the internal operating frequency of the chip must be the same as the output operating frequency if an odd address is input. Therefore, the circuitry leading into the temporary latch circuit 60 must be able to operate at the full output operating frequency of the chip.

Accordingly, a need remains for a prefetch scheme which overcomes the above-mentioned problems.

SUMMARY OF THE INVENTION

It is, therefore, an object of the invention to operate the internal structure of a memory device at a lower frequency than the external output operating frequency.

Another object of the invention is to reduce the chip area required for implementing a prefetch scheme for a semiconductor memory device.

A further object of the invention is to improve the design margin for the internal portions of a semiconductor memory device.

To achieve these and other objects, the applicant has invented a method and apparatus for implementing a prefetch scheme in which a plurality of data are simultaneously read from memory cells of sequential address synchronized to an external signal and serially transferred from the memory cells to a temporary latch circuit which has a number of bits corresponding to the number of bits in the prefetch scheme. The bits in the temporary latch circuit are multiplexed and sequentially driven out of the memory device. The memory device includes a plurality of memory cells which are connected to an input/output line pair through a plurality of column select gates, each of which is controlled by an independent chip select line. A sense amplifier is connected to the input/output line pair for sensing and amplifying data from the input/output lines and to transmit data to the input/output lines. A data output buffer transfers the data from the sense amplifier to the outside of the chip.

The foregoing and other objects, features and advantages of the invention will become more readily apparent from the following detailed description of a preferred embodiment of the invention which proceeds with reference to the accompanying drawings.

BRIEF DESCRIPTION OF THE DRAWINGS

FIG. 7 is a table showing the state of various control signals required to place the predecoder of FIG. 6 in various operating modes.

FIG. 8 is a table showing the increasing sequence of addresses in the interleave mode and the sequential mode when using address lines CA1 and CA0 for counting with the predecoder of FIG. 6.

FIG. 9 is a table showing the increasing sequence of addresses in the interleave and sequential modes when counting using column address bits CA0, CA1 and CA2 with the predecoder of FIG. 6.

DETAILED DESCRIPTION

In a prior art semiconductor memory device which uses a conventional prefetch scheme, if the input address is an odd number, it is impossible to reduce the internal operating frequency of the chip with respect to the external output operating frequency. To avoid this disadvantage, the usage may be constrained so that the number of bits in the prefetch N is equal to or more than a burst length provided in the chip, or, so that only even column addresses are input. However, in the former case, the number of independent data paths must correspond to the size of the prefetch N which causes the layout area of the chip to increase. However, in the latter case, the bandwidth of the memory chip is limited.

Accordingly, an object of the present invention is to overcome the problems presented by an odd input address by improving the column address decoding method as discussed below.

Figure 4:
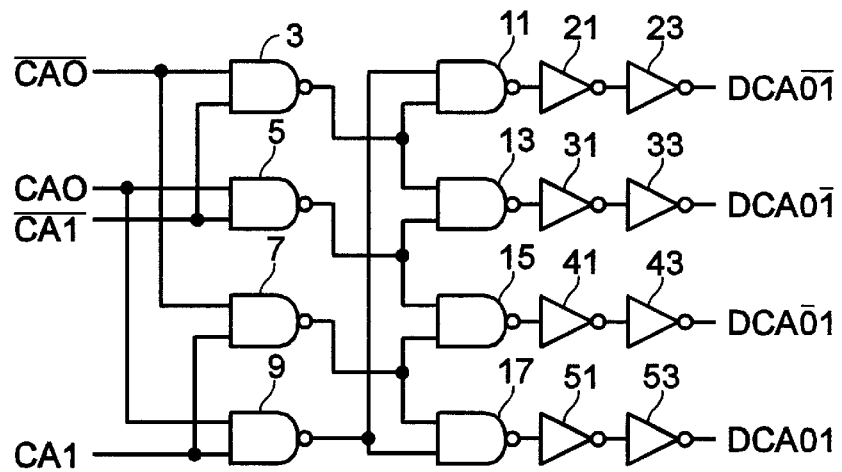
FIG. 4 is a schematic diagram of an embodiment of a column predecoder for a prefetch scheme in accordance with the present invention.

An embodiment of a column predecoder for a prefetch scheme in accordance with the present invention is shown in FIG. 4. The column decoder comprises a first stage of four NAND gates 3, 5, 7 and 9. Column address line CA0 is connected to one input terminal of NAND gates 5 and 9, while a complementary signal/CA0 is input to one input terminal of each of NAND gates 3 and 7. Column address signal CA1 is input to the other input terminals of NAND gates 7 and 9, while a complementary signal/CA1 is input to the second input terminals of NAND gates 3 and 5. The circuit of FIG. 4 also includes a second stage of two-input NAND gates 11, 13, 15 and 17. The output terminal of NAND gate 3 is connected to one input terminal of each of NAND gates 11 and 13, the output terminal of NAND gate 5 is connected to the other input terminal of NAND gate 13 and one input terminal of NAND gate 15, the output terminal of NAND gate 7 is connected to the other input terminal of NAND gate 15 and one input terminal of NAND gate 17, and the output terminal of NAND gate 9 is connected to the remaining input terminals of NAND gates 11 and 17. A pair of inverters 21 and 23, a pair of inverters 31 and 33, a pair of inverters 41 and 43, and a pair of inverters 51 and 53 are each arranged in series with the output terminals of NAND gates 11, 13, 15 and 17, respectively, to output decoded values and delay the outputs of the second stage of NAND gates.

Figure 1:
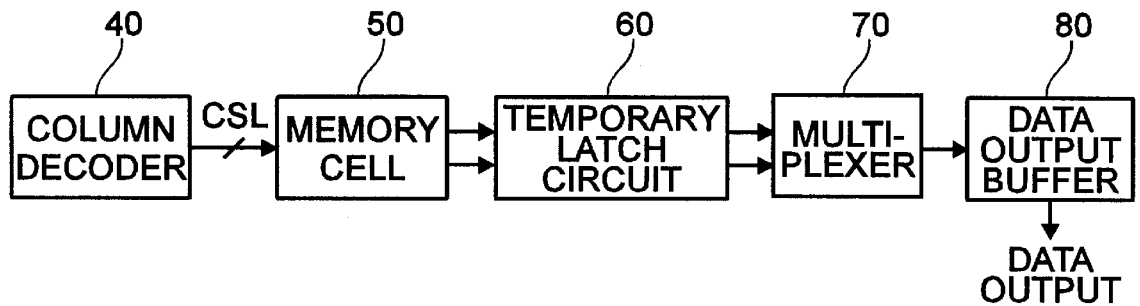
FIG. 1 is a block diagram of a prior art semiconductor memory device which implements a prefetch scheme.
Figure 2:
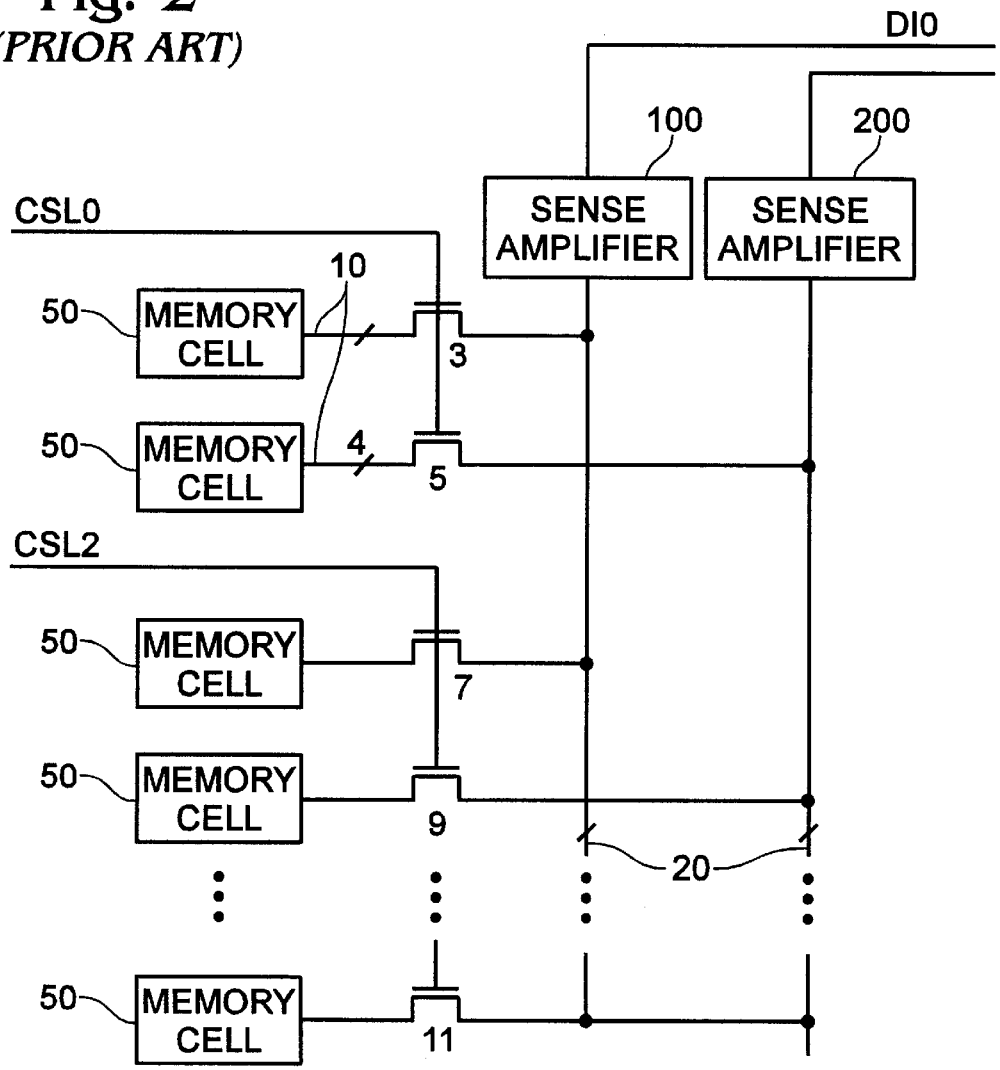
FIG. 2 is a schematic diagram of a portion of a prior art semiconductor memory device showing the configuration of the memory cells which are decoded by a conventional column decoder in a two-bit prefetch scheme.
Figure 3A:
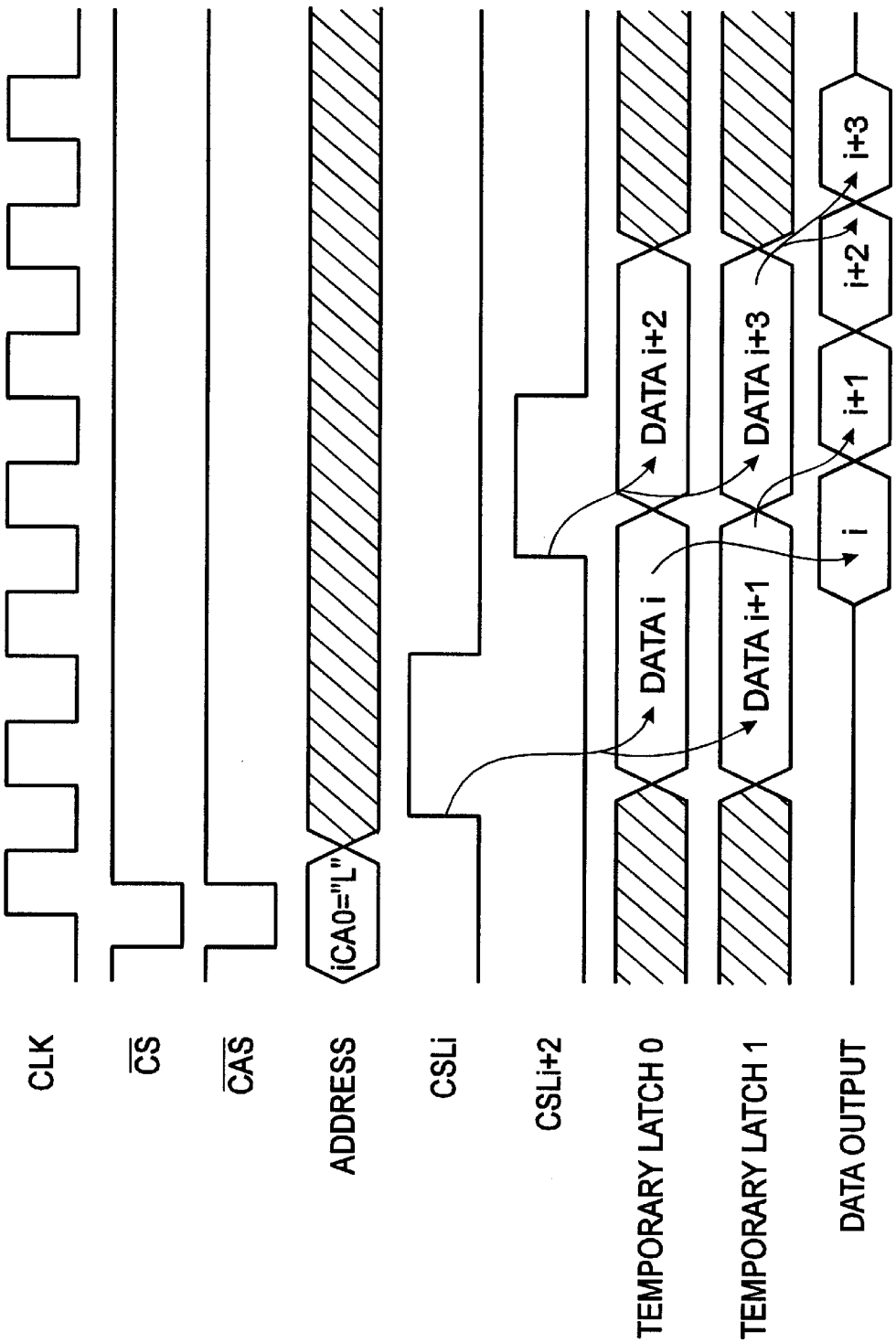
FIG. 3A is a timing diagram illustrating the internal operation of a prior art semiconductor memory device which implements a conventional prefetch scheme wherein the input address is an even number.
Figure 3B:
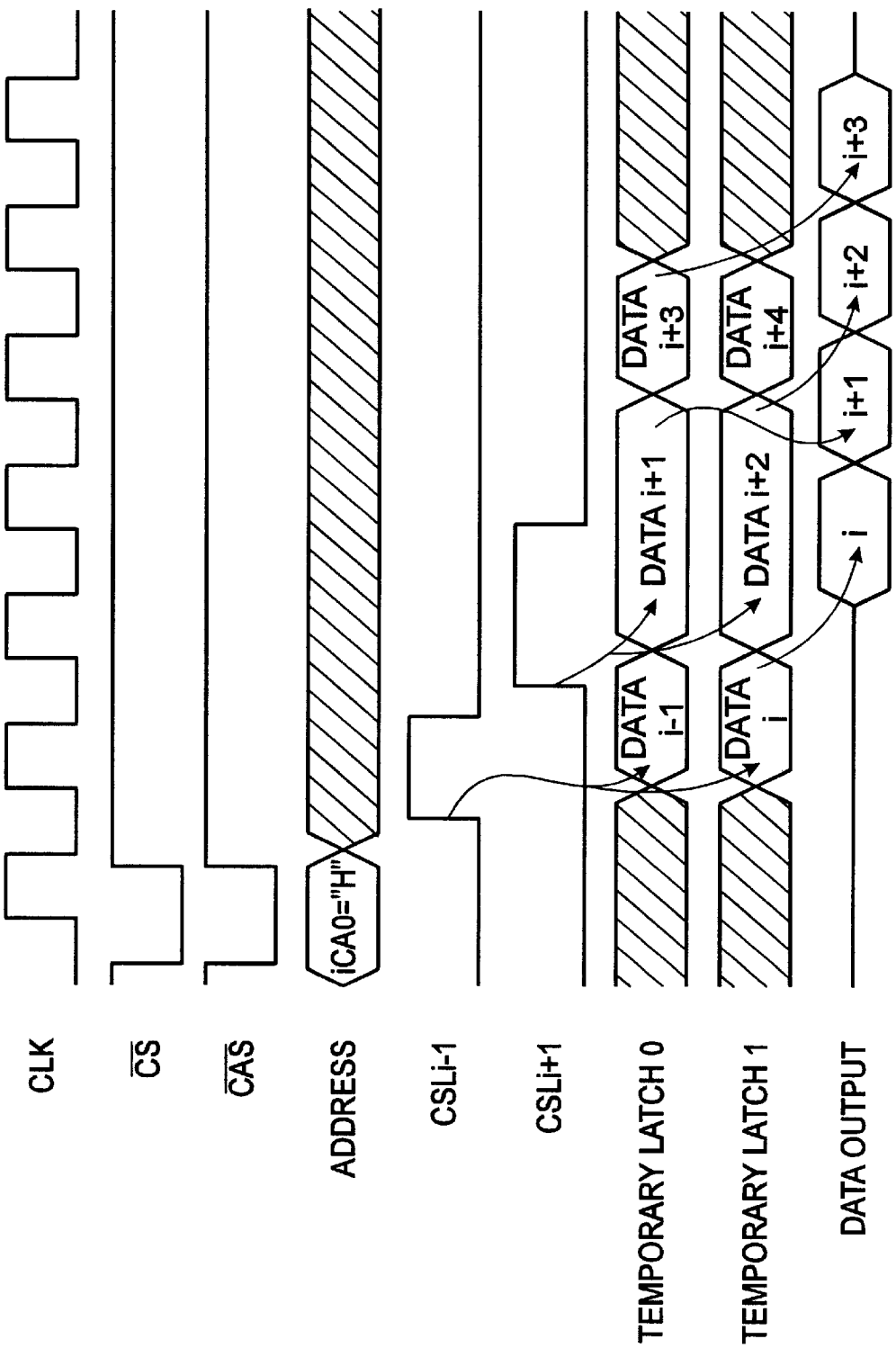
FIG. 3B is a timing diagram illustrating the internal operation of a prior art semiconductor memory device which implements a conventional prefetch scheme wherein the input address is an odd number.
Figure 3C:
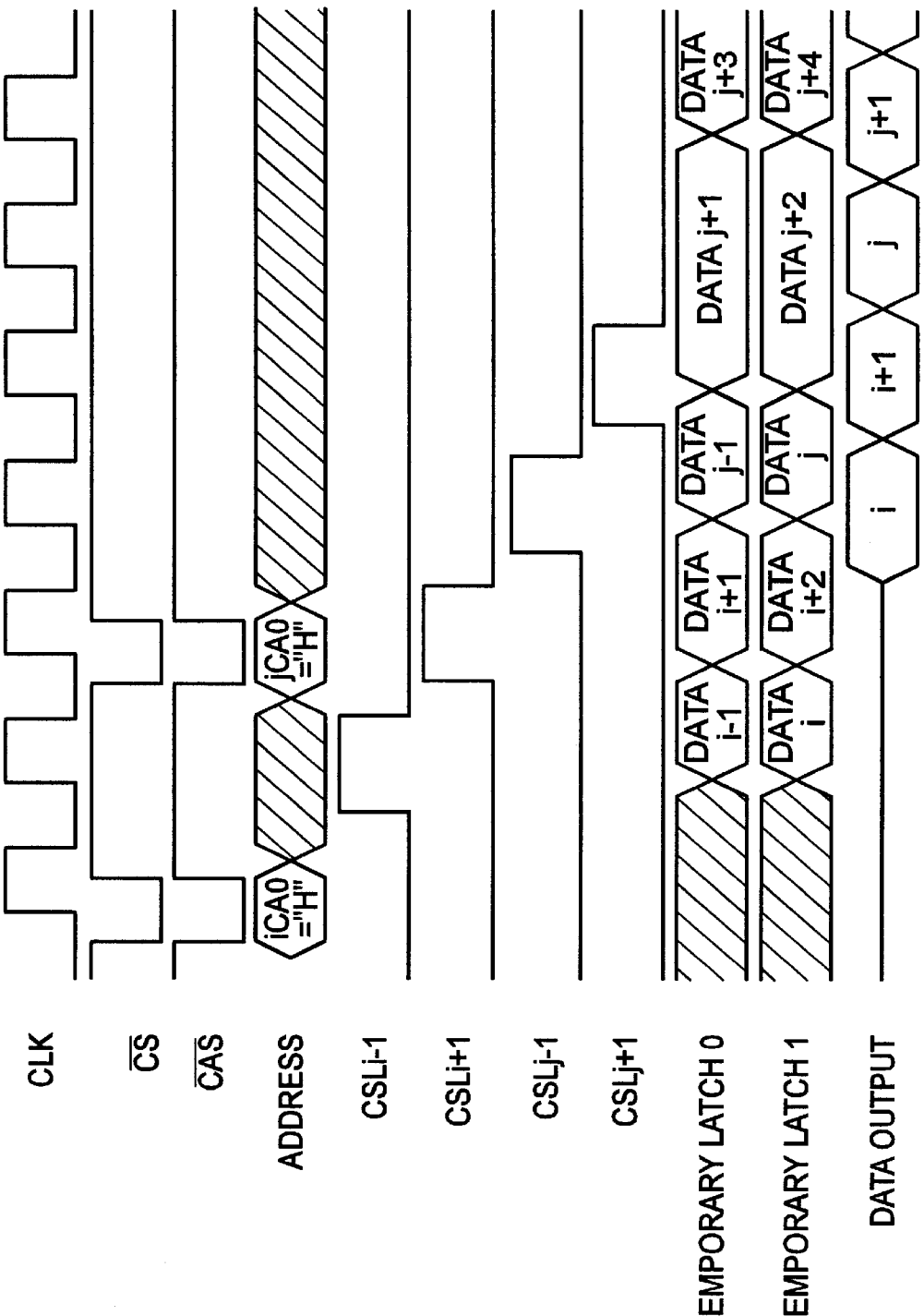
FIG. 3C is a timing diagram illustrating the internal operation of a prior art semiconductor memory device which implements a conventional prefetch scheme wherein the input address is an odd number and a read command is repeatedly executed.
Figure 5:
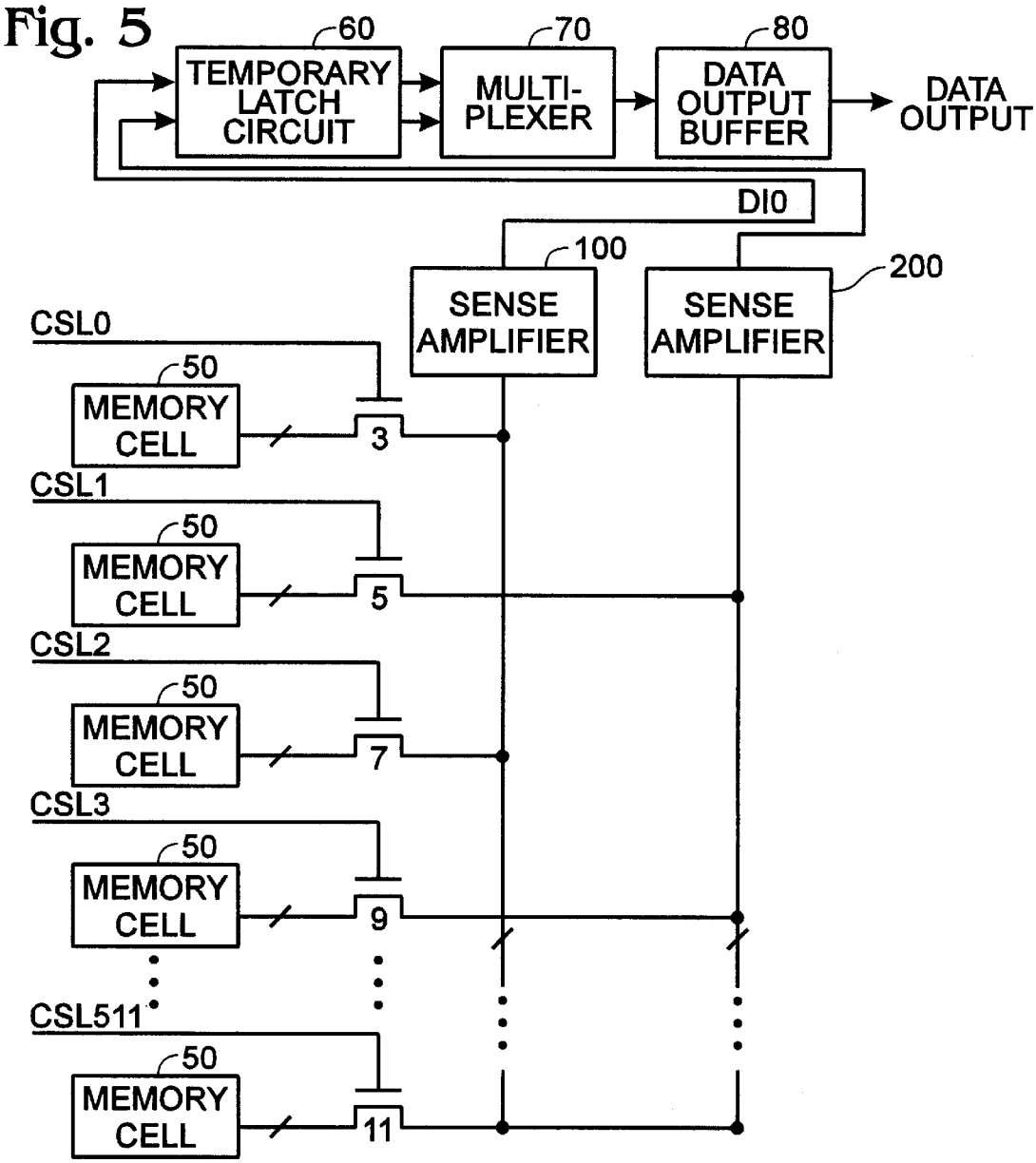
FIG. 5 is a schematic diagram of an embodiment of a memory cell gate arrangement in accordance with the present invention.

Referring to FIG. 5, a column select arrangement in accordance with the present invention includes a plurality of memory cells 50 which are coupled to input/output lines through column select gates 3, 5, 7, 9 . . . 11 which are each controlled individually by a separate column select line CSLi. Since the column addressed line CA0 is used for decoding the column select lines in FIG. 5, each column select gates is controlled by an individual column select line. This is in contrast to the column decoding arrangement shown in FIG. 2 in which column address line CA0 is not used for decoding the column select line, but instead is used for multiplexing the data from the temporary latch to transfer it to the output. Therefore, two column select gates in FIG. 2, were hard-wired to a single column select line. Because the column select gates of FIG. 5 are controlled by individual column select lines, the number of column select lines in FIG. 5 is twice that in FIG. 2, and as a result, the number of column select lines equals the number of column select lines required if a prefetch scheme is not used.

In operation, the column decoder of FIG. 4 achieves a two-bit prefetch scheme using column address line CA0 to decoder the column address select lines. If the burst lengths equal 4, and a higher column select line is enabled by the decoding column address DCA01 of the predecoder, the next column select line is enabled as well. Thus, the internal operation of the memory chip is performed at half of the speed of the external output operation regardless of whether the input column address is an even or odd number.

Figure 6:
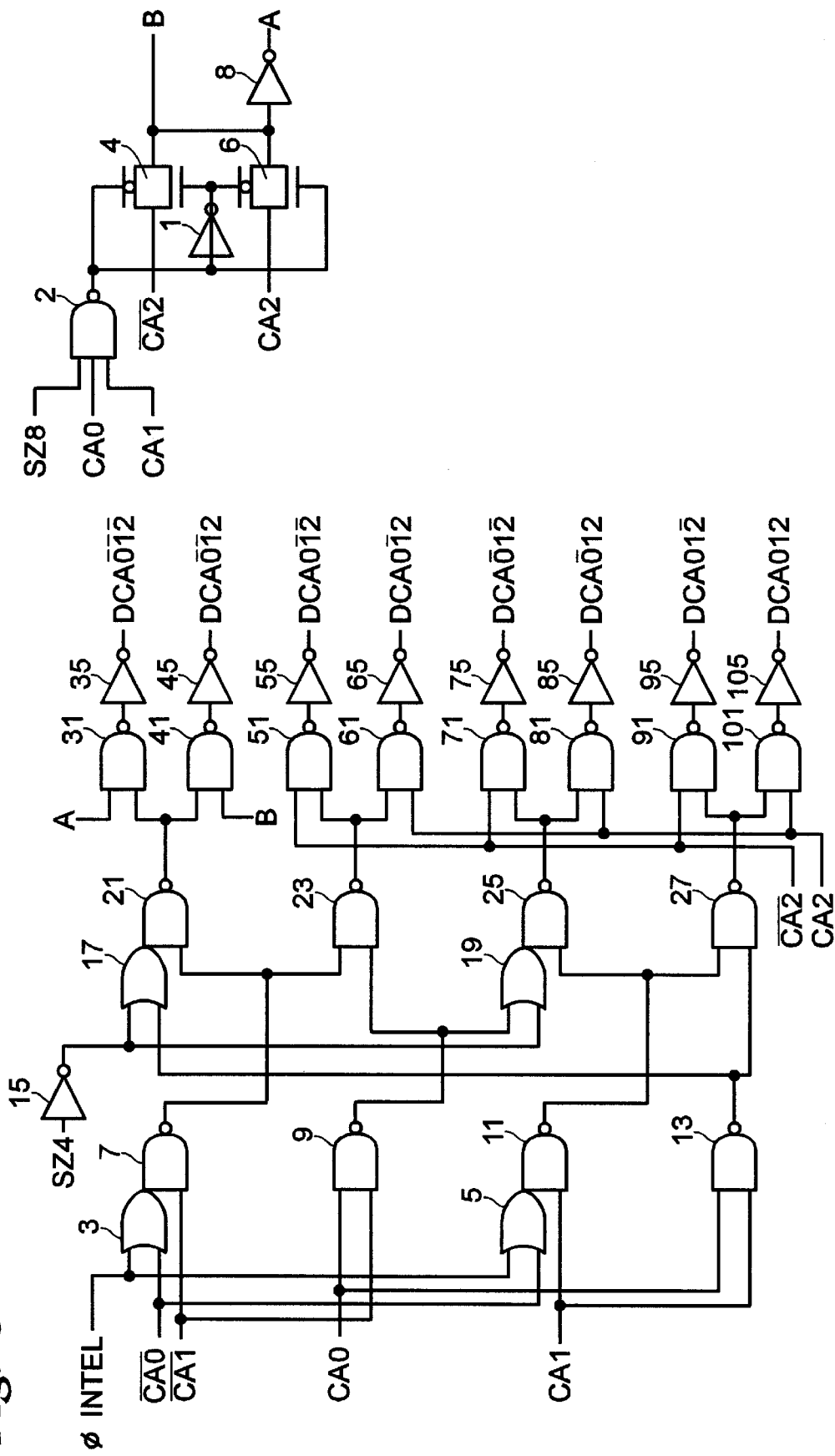
FIG. 6 is a schematic diagram of a second embodiment of a column predecoder for a prefetch scheme in accordance with the present invention.

If the operating mode of the chip is programmed for a counting type of operation, such as interleaved or sequential with a burst length of 2, 4, and 8, it is difficult to apply the embodiment of FIG. 4. An embodiment of a column predecoder for operating in the above-mentioned modes is shown in FIG. 6. The circuit of FIG. 6 operates in both interleave and sequential modes. The circuit includes a first input terminal for receiving a burst select signal φ INTEL, a second control terminal for receiving a first burst length select signal SZ4, a third input terminal for receiving a second burst length select signal SZ8, and six address input terminals for receiving column address signals CA0, CA1 and CA2 and complementary signals /CA0, /CA1 and /CA2, respectively. The circuit also includes eight output terminals for outputting eight decoding column address signals DAC012.

The predecoder of FIG. 6 includes a first stage comprising four two-input NAND gates and two two-input OR gates. OR gate 3 receives the signals φ INTEL and /CA0, as does OR gate 5. NAND gate 7 receives the signal/CA1 and the output of OR gate 3. NAND gate 9 receives the signals CA0 and/CA1. NAND gate 11 receives the signal CA1 and the output signal from OR gate 5. NAND gate 13 receives the signal CA0 and CA1.

The circuit of FIG. 6 includes a second stage comprising four two-input NAND gates 21, 23, 25 and 27 and two two-input OR gates 17 and 19, and an inverter 15. Inverter 15 has an input terminal coupled to the second control terminal to receive the first burst length select signal SZ4. OR gate 17 receives the output signals from inverter 15 and NAND gate 13. OR gate 19 receives the output signals from inverter 15 and NAND gate 9. NAND gate 21 receives the output signals from OR gate 17 and NAND gate 7, and NAND gate 23 receives the output signals from NAND gates 7 and 9. NAND gate 25 receives the output signals from OR gate 19 and NAND gate 11, while NAND gate 27 receives the output signals from NAND gates 11 and 13.

The circuit of FIG. 6 further includes a third stage comprising eight two-input NAND gates 31, 41, 51, 61, 71, 81, 91 and 101. One input terminal of each of NAND gates 51, 71 and 91 receive the signal/CA2, while one input terminal of NAND gates 61, 81 and 101 receive the signal CA2. The remaining input terminals of NAND gates 51 and 61, 71 and 81, and 91 and 101 receive the output signals from NAND gates 23, 25 and 27, respectively. One input terminal of each of NAND gates 31 and 41 receives the output signal from NAND gate 21. The remaining input terminals of NAND gates 31 and 51 receive signals A and B, respectively, which are generated by a multiplexing section. The predecoder also includes a final stage comprising eight inverters 35, 45, 55, 65, 75, 85, 95 and 105 which are connected in series with the output terminals of NAND gates 31 through 101, respectively.

The multiplexing section operates to switch the column select lines CA2 and /CA2 between lines A and B using the following structure. A three-input NAND gate 2 receives the second burst length select signal SZ8, and column address signals CA0 and CA1. The signal /CA2 is connected through the controlled current path of a first transmission gate 4 to the terminal B. The signal CA2 is connected through the controlled current path of a second transmission gate 6 to the input terminal of an inverter 8 which has an output terminal connected to terminal A. Terminal B is also connected directly to the input terminal of inverter 8. The output terminal of NAND gate 2 is connected directly to the inverting control terminal of transmission gate 4, the non-inverting control terminal of transmission gate 6, and the input terminal of an inverter 1. The output terminal of inverter 1 is connected directly to the noninverting control terminal of transmission gate 4 and the inverting control terminal of transmission gate 6.

As can be seen by referring to Table 1 of FIG. 7, for operation in the interleave mode with a burst length of 2, the burst select signal φ INTEL is driven to a high logic state while the burst length select signals SZ4 and SZ8 are both driven to logic low states. For operation in the sequential mode with a burst length of 4, the burst select signal φ INTEL is driven low, while signals SZ4 and SZ8 are driven to the high and low logic states, respectively. For operation in the sequential mode with a burst length of 8, first select signal φ INTEL is driven low, and signals SZ4 and SZ8 are both driven high. These configurations are attributed to the characteristics of the interleave and sequential modes and their relative impact upon the address decoding.

In the interleave mode, it is possible to use the conventional decoder even though the starting address is odd, since the next address input is not a higher address (−1), but rather, a lower address (−1), and data for an odd address is output using previously fetched data from the temporary latch circuit. Thus, it can be said that the interleave mode is the proper mode for a prefetch scheme.

In the sequential mode, however, these advantages cannot be obtained and therefore, the prefetch scheme of the present invention is required for cases in which the burst length is 2, 4, or 8. In the case of a burst length of 4, i.e., using the two-bits CA0 and CA1 for counting, the first embodiment of the predecoder shown in FIG. 4 can be used. For a burst length of 2, i.e., counting with a single bit CA0, or a burst length of 8, i.e., counting with three-bits CA0, CA1 and CA2, the implement of a predecoder circuit shown in FIG. 6 can be used and signals SZ4, SZ8 and φ INTEL can be used to configure the operating mode of the circuit. The interleave mode is unified with the predecoder which supports the sequential mode by means of the burst select signal φ INTEL. When using only a single bit CA0 for counting (burst length=2), the sequential mode and interleave mode are basically identical. Thus, referring to Table 1 of FIG. 7, the burst select signal φ INTEL is set to the logic high level for both sequential mode with bit length=2 and interleave mode with bit length=2.

Table 2(i) of FIG. 8 shows the increasing sequence of the address in the interleave mode and the sequential mode when using address lines CA1 and CA0 for counting. Table 2(ii) of FIG. 9 shows the increasing sequence of addresses in the interleave and sequential modes when counting using column address bits CA0, CA1 and CA2.

As an example, in the sequential mode, when counting with two bits, if the address 3 (−11) is selected, the address 0 (=00) is selected at the same time. However, in the sequential mode when using three bits for counting, if address 3 (=011) is selected, the address 4 (=100) is selected at the same time. Referring to FIG. 6, when DCA01/2 is selected in the sequential mode with burst length =4 (φ INTEL=0, SZ4=1, SZ8=0), "a" corresponds to /CA2 and "b" corresponds to CA2, and accordingly, DCA/0/1/2 is also selected. However, if DCA01/2 is selected in the sequential mode with burst length =8 (φ INTEL=0, SZ4=1, SZ8=1), "a" corresponds to CA2 and "b" corresponds to /CA2, and accordingly, DCA/0/12 is also selected. In the interleave mode, the column address CA0 always selects two codings which are different from each other.

Thus, by employing the prefetch scheme of the present invention, the internal circuitry of a semiconductor memory device can always operate at a reduced frequency with respect to the external operating frequency, resulting in the advantage of safer design margins inside of the chip.

Having described and illustrated the principles of the invention in a preferred embodiment thereof, it should be apparent that the invention can be modified in arrangement and detail without departing from such principles. I claim all modifications and variations coming within the spirit and scope of the following claims.

I claim:

1. A semiconductor memory device comprising:
   a latch for storing prefetch data;
   an input/output line pair coupled to the latch;
   a plurality of memory cells;
   a plurality of column select lines; and
   a plurality of column select gates, each gate having a controlled current path and a control terminal, the controlled current path of each gate coupled between a memory cell and one of the input/output lines, the control terminal of each column select gate coupled to a separate column select line, whereby the column select gates transfer prefetch data from the memory cells to the latch responsive to column select signals on the column select lines.

2. A memory device according to claim 1 further including a sense amplifier coupled to one of the input/output lines for sensing and amplifying data from the input/output line.

3. A memory device according to claim 2 further including a data output buffer coupled to receive data from the sense amplifier.

4. A memory device according to claim 1 wherein each column select gate in an NMOS transistor.

5. A memory device according to claim 1 further including a column decoder that enables at least two of the column select lines simultaneously.

6. A memory device according to claim 1 wherein each memory cell is coupled to a column select gate by a bit line.

7. A memory device according to claim 1 further including a predecoder coupled to the column select lines for decoding the column select lines responsive to a column address, wherein the predecoder decodes the column select line responsive to the least significant bit of the column address, thereby enabling a first column select line and the next column select line simultaneously regardless of whether the column address is even or odd.

8. A method of prefetching data in a semiconductor memory device, the memory device comprising: a latch for storing prefetch data; an input/output line pair coupled to the latch; a plurality of memory cells; a plurality of column select lines; and a plurality of column select gates, each gate having a controlled current path and a control terminal, the controlled current path of each gate coupled between a memory cell and one of the input/output lines, the control terminal of each column select gate coupled to a separates column select line, whereby the column select gates transfer prefetch data from the memory cells to the latch responsive to column select signals on the column select lines; the method comprising:
   enabling a first column select line, thereby transferring a first bit of prefetch data from a first memory cell to the latch; and
   simultaneously enabling a second column select line, thereby transferring a second bit of prefetch data from a second memory cell to the latch.

9. A method according to claim 8 wherein the first and second column select lines are coupled to the control terminals of adjacent column select gates.

10. A method of decoding a column a column address in a memory device having a multi-bit prefetch scheme in which N memory cells are decoded simultaneously, the method comprising controlling each of the N memory cells responsive to a separate one of N column select lines.

11. A method according to claim 10 further including decoding the column select lines responsive to the least significant bit of the column address, whereby a first column select line and the next column select line are both enabled simultaneously regardless of whether the column address is even or odd.

* * * * *

UNITED STATES PATENT AND TRADEMARK OFFICE
CERTIFICATE OF CORRECTION

PATENT NO. : 5,835,446
DATED : November 10, 1998
INVENTOR(S) : Churoo Park

It is certified that error appears in the above-identified patent and that said Letters Patent is hereby corrected as shown below:

<u>Title page,</u>
Item [57], ABSTRACT,
Line 6, "member of bits" should read -- number of bits --;

<u>Column 1,</u>
Line 62, "can be operates" should read -- can be operated --;

<u>Column 2,</u>
Line 43, can been seed" should read -- can be seen --;

<u>Column 3,</u>
Line 10, "sequential address" should read -- sequential addresses --;

<u>Column 5,</u>
Line 5, " "to decoder" should read -- to decode --;

<u>Column 6,</u>
Line 32, "higher address (-1)" should read -- higher address (+1) --;
Line 58, "sequence of the address" should read -- sequence of the addresses --;
Line 64, "the address 3(-11)" should read -- the address 3 (=11) --;

<u>Column 7,</u>
Line 45, "gate in an" should read -- gate is an --;

<u>Column 8,</u>
Line 8, "line" should read -- lines --;
Line 21, "separates" should read -- separate --;
Line 36, "a column a column address" should read -- a column address --.

Signed and Sealed this

Ninth Day of July, 2002

*Attest:*

*Attesting Officer*

JAMES E. ROGAN
*Director of the United States Patent and Trademark Office*